United States Patent [19]

Schneider

[11] Patent Number: 5,910,794
[45] Date of Patent: Jun. 8, 1999

[54] METHOD AND APPARATUS FOR STORING AND ROTATING BIT PATTERNS

[75] Inventor: Claus Schneider, München, Germany

[73] Assignee: Océ Printing Systems GmbH, Poing, Germany

[21] Appl. No.: 08/776,558
[22] PCT Filed: May 18, 1995
[86] PCT No.: PCT/DE95/00660
  § 371 Date: Jan. 30, 1997
  § 102(e) Date: Jan. 30, 1997
[87] PCT Pub. No.: WO96/02915
  PCT Pub. Date: Feb. 1, 1996

[30] Foreign Application Priority Data

Jul. 13, 1994 [DE] Germany .............................. 44 24 734

[51] Int. Cl.⁶ ....................................................... G09G 5/34
[52] U.S. Cl. ............................................. 345/126; 345/509
[58] Field of Search ..................................... 345/126, 141, 345/149, 509

[56] References Cited

U.S. PATENT DOCUMENTS

4,875,190 10/1989 Sakano .
4,935,897 6/1990 Kurihara et al. .
5,396,236 3/1995 Ueda ......................................... 345/126

*Primary Examiner*—Matthew Luu
*Attorney, Agent, or Firm*—Hill & Simpson

[57] ABSTRACT

A bit configuration stored in a matrix of a grid module is read out to a reproduction device. Wiring outlay is drastically reduced by combining a plurality of memory cells in a matrix cells with only one output and an internal data selection.

8 Claims, 8 Drawing Sheets

METHOD AND APPARATUS FOR STORING AND ROTATING BIT PATTERNS

BACKGROUND OF THE INVENTION

1. Field of the Invention

The invention is directed to a method and apparatus for storing and rotating bit patterns. The bit patterns can be written into and in turn read out from matrix cells of a memory matrix. A bit pattern represents image information resolved into its individual pixels. Such image information that has been processed, for example, in picture screen devices and other display units and in copier and printer devices for reproducing the image information on a recording medium.

2. Description of the Related Art

U.S. Pat. No. 5,012,434 discloses an electrographic printer that receives image information to be printed from a data processing device. This encoded image information is converted into a bit pattern by a printer controller and potentially rotated. The bit pattern is read out to a following reproduction means that transfers the bit pattern and, thus, the image information onto a recording medium.

Memory matrices are usually employed for rotating the bit patterns, the matrix cells of the memory matrices being capable of being randomly accessed with the assistance of peripheral selection elements. For example, it is thus possible to write or read entire rows or entire columns into and out of the memory matrix in parallel. To that end, each matrix cell comprises exactly one memory cell in which one pixel can be deposited in the form of a logical zero or one. Each matrix cell is respectively connected via a first line to a row multiplexer and via a second line to a column multiplexer. The column multiplexers and row multiplexers thereby serve as peripheral selection elements. Dependent on the size of the memory matrix, a plurality of lines is therefore required from the matrix cells to the matrix periphery. The size of a realizable matrix is limited as a result thereof.

U.S. Pat. No. 4,935,897 discloses a memory unit for use in a printer. The memory unit can be employed as a buffer memory for image data. A picture element can thereby be stored at each matrix point of the memory unit. Picture elements can be read out by designational control with a row decoder and a column decoder such that an image rotation thus ensues.

U.S. Pat. No. 4,875,190 discloses a two-dimensional memory unit that contains memory modules arranged in a matrix form. Each memory module itself is a two-dimensional memory capable of random access and organized in a matrix form. All memory modules are identical and are addressed with an address bus that is nine bits wide, as a result whereof a specific matrix cell that is the same in all memory modules can always be simultaneously selected.

SUMMARY OF THE INVENTION

The present invention is therefore based on the object of providing an apparatus and a method for storing and rotating bit patterns, whereby the number of connecting lines between the matrix cells and the matrix periphery is reduced without modification of the matrix size.

This and other objects and advantages of the invention are achieved by a method for storing and rotating bit patterns in a raster module that comprises a memory matrix that contains a plurality of matrix cells and can be coupled to a reproduction means via peripheral selection elements, including the method steps of storing a bit pattern present in the form of pixels of an original matrix such that at least one pixel of the original matrix is stored in each matrix cell of the memory matrix; and reading the bit pattern out from the memory matrix, whereby specific matrix cells are selected dependent on a rotation information and respectively one pixel within these matrix cells is selected with an internal selection element and read out to the reproduction means.

A further advantage is provided by the pixels of the original matrix being stored in the matrix cells of the memory matrix such that each matrix cell contains the pixels that are congruent with one another after folding the original matrix over at least one of its diagonals.

In a preferred embodiment, a raster module is provided that is allocated to an electrographic printer and in whose memory matrix the bit pattern is stored row-by-row or column-by-column and is read out row-by-row or column-by-column.

Further, a raster module for storing and rotating bit patterns is provided according to the invention that contains a memory matrix that contains a plurality of matrix cells and that can be coupled to a reproduction means via peripheral selection elements; at least one memory cell per matrix cell for storing a bit pattern present in the form of pixels of an original matrix such that at least one pixel of the original matrix is storable in each matrix cell of the memory matrix; internal selection elements in the matrix cells for the selection of specific memory cells within the matrix cells and for coupling the outputs of these memory cells to the reproduction means; and a readout control means that drives the selection elements dependent on a rotation information of the bit pattern.

In the preferred raster module, the bit patterns can be read out row-by-row or column-by-column to the reproduction means, including matrix cells that respectively comprise a data output, respectively contain memory cells for the acceptance of the pixels of an original quadratic matrix that lie on top of one another given folding of said original matrix at at least one of its diagonals, respectively contain an internal selection element for coupling their data output to respectively one of the memory cells contained in them; and including peripheral selection elements for the selective coupling of the data outputs of matrix cells to the reproduction means.

A transposition is means arranged preceding the reproduction means that selectively reverses the sequence of the pixels of a read out column or row dependent on its drive by the readout control means. A memory matrix is provided for storing an original matrix with n columns and n rows folded x-times at its diagonals, whereby the memory matrix comprises $$\frac{n^2}{2^x} + \frac{n}{2}$$

matrix cells.

The raster module for storing and rotating bit patterns as set forth above is preferably used in an electrographic printer.

The overall wiring outlay is drastically reduced by combining a plurality of memory cell in a matrix cells with only one output and an internal data selection. Larger memory matrices can be realized with given technical possibilities as a result thereof.

The information that is stored in which memory cell can be optimized in view of fast readout. When, as provided above, row-by-row and column-by-column readout is desired, only pixels whose information need not be simultaneously read out are combined in the memory cells of a matrix cell. Such pixels are found by folding the original quadratic memory cell over at least one of its diagonals. The pixels lying congruently on top of one another after the folding can be combined in a matrix cell. Pixels of a matrix position for a plurality of rotational senses are thus combined in the memory cells of a matrix cell given an original matrix that is folded correspondingly often. The selection of which memory cell is to be connected to the data output of the matrix cell is undertaken by the internal selection element provided in the matrix cell. The number of control lines needed therefor is slight compared to the plurality of connecting lines that are saved between the matrix cells and matrix periphery.

BRIEF DESCRIPTION OF THE DRAWINGS

An example of the invention is explained in greater detail below with reference to the drawing. Thereby shown are.

DETAILED DESCRIPTION OF THE PREFERRED EMBODIMENTS

Figure 12:
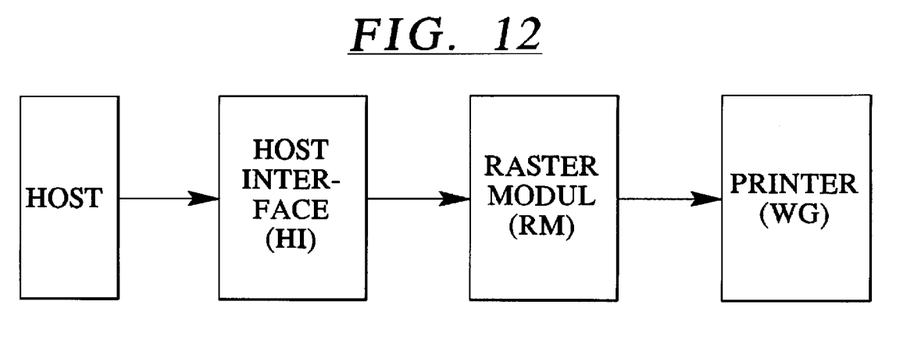
FIG. 12 is a schematic illustration of the image generation of a printer.

FIG. 12 schematically shows the structure of the image generation of a printer. An image information is forwarded in encoded form from a computer HOST to a channel interface HI (host interface). The encoded image information is converted into a bit pattern on a following raster module RM. Among other things, this raster module RM contains a memory matrix (described below) for storing and rotating bit patterns. The bit pattern generated in the raster module RM is output to a reproduction unit WG, for example a printer (PRINTER).

Figure 1:
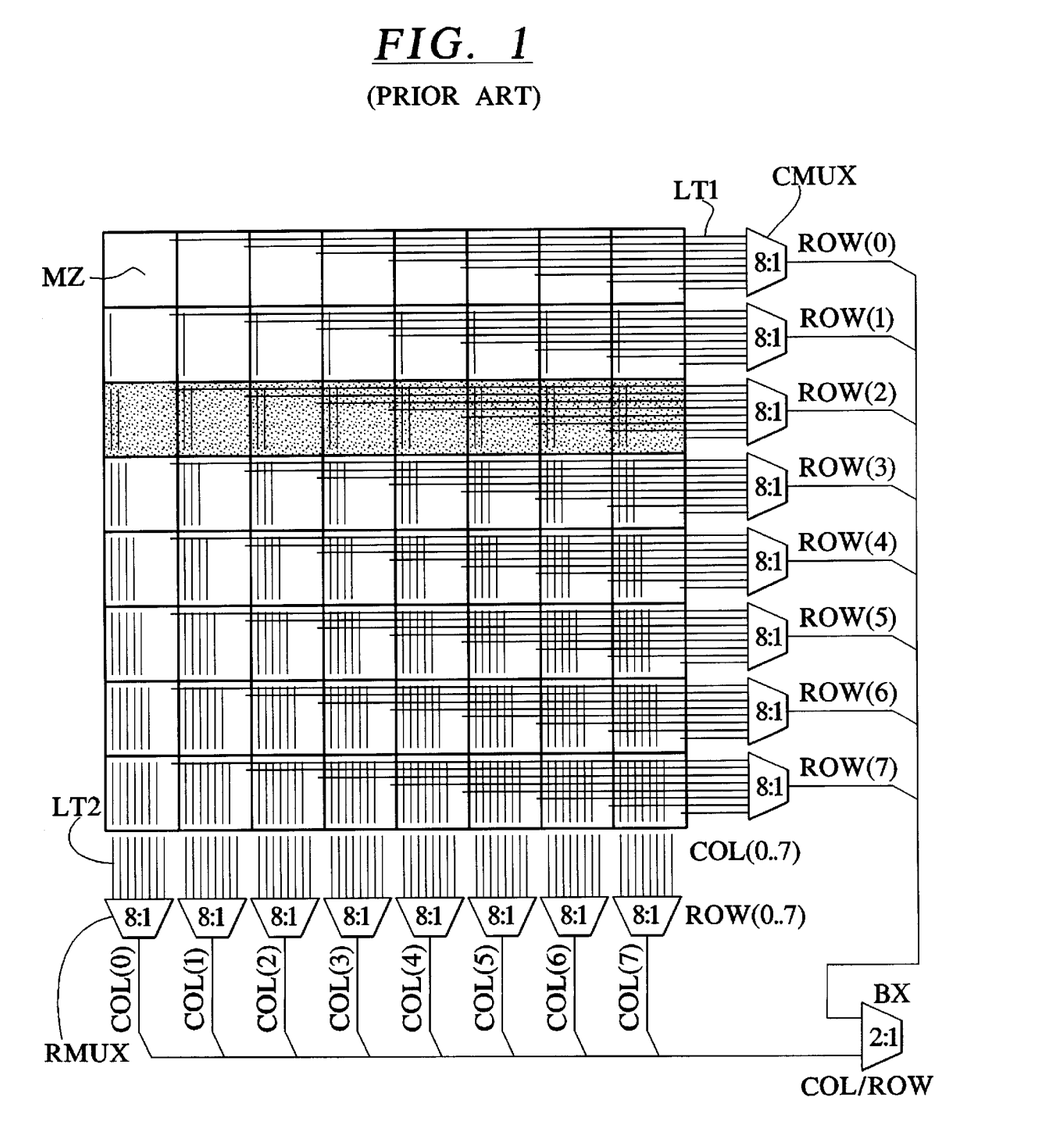
FIG. 1 is a schematic circuit diagram of a memory matrix of the prior art.

FIG. 1 shows an original quadratic matrix with n=8 columns COL and n=8 rows ROW. A row multiplexer RMUX is allocated to each column. Each row multiplexer RMUX is connected via second lines LT2 to data outputs of matrix cells MZ. Respectively one data output of a matrix cell MZ can thus be connected to the output of the row multiplexer RMUX with the 8:1 row multiplexer RMUX. One of the rows ROW (0 . . . 7) of the memory matrix can thus be read out with the assistance of the row multiplexer RMUX.

Eight column multiplexers CMUX are also arranged in the matrix periphery. An input of a column multiplexer CMUX is respectively connected to a matrix cell MZ of a row ROW of the memory matrix via a first line LT1. As a result thereof, the output of the column multiplexer CMUX can be connected to one of the matrix cells MZ of the respective row ROW. A column COL (0 . . . 7) of the memory matrix can thus be read out with the assistance of the column multiplexer CMUX. Given this memory matrix of the prior art, thus, twice as many lines LT1 and LT2 between the matrix cells MZ and the row or, respectively, column multiplexers RMUX, CMUX as there are matrix cells MZ are required.

Given such an original quadratic matrix, a rotating of the bit pattern deposited in the memory matrix is undertaken in a known way. For example, a column COL (0 . . . 7) is selected instead of a row ROW (0 . . . 7) and the bit sequence in the data word that is read is subsequently transposed.

Figure 2:
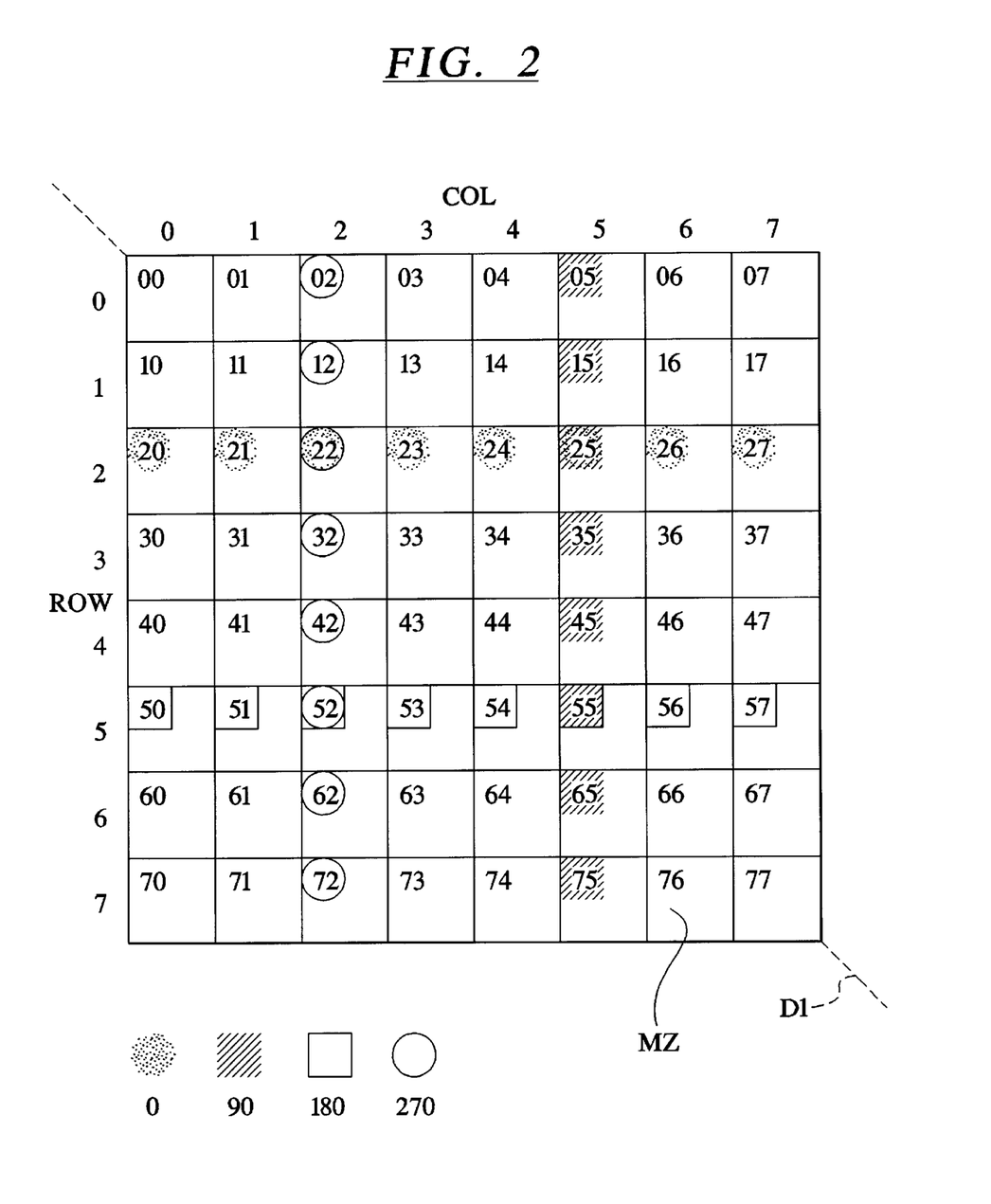
FIG. 2 a schematic illustration of a memory matrix with a first diagonal.

According to the present invention, the original matrix can now be folded over its diagonals. An original matrix is shown in FIG. 2. A cell index is entered in every matrix cell MZ. The matrix cell MZ of the column zero COL (0) and the row zero ROW (0) is referenced with the index 00. The other matrix cells MZ are correspondingly referenced. The matrix cells MZ of the row two ROW (2) are respectively marked with a shaded circle. This marking corresponds to a position of the row 2 ROW (2) rotated by 0°. The matrix cells MZ in which this row ROW (2) lies after a respective rotation by another 90° are marked in the following way: a shaded rectangle corresponds to a rotation by 90°, a quadratic box corresponds to a rotation by 180°, a circle corresponds to a rotation by 270°. A first diagonal D1 proceeds diagonally over the memory matrix from the matrix cell MZ with the index 00 to the matrix cell MZ with the index 77. The original matrix is folded over this first diagonal D1. The result of this folding is shown in FIG. 3.

Figure 3:
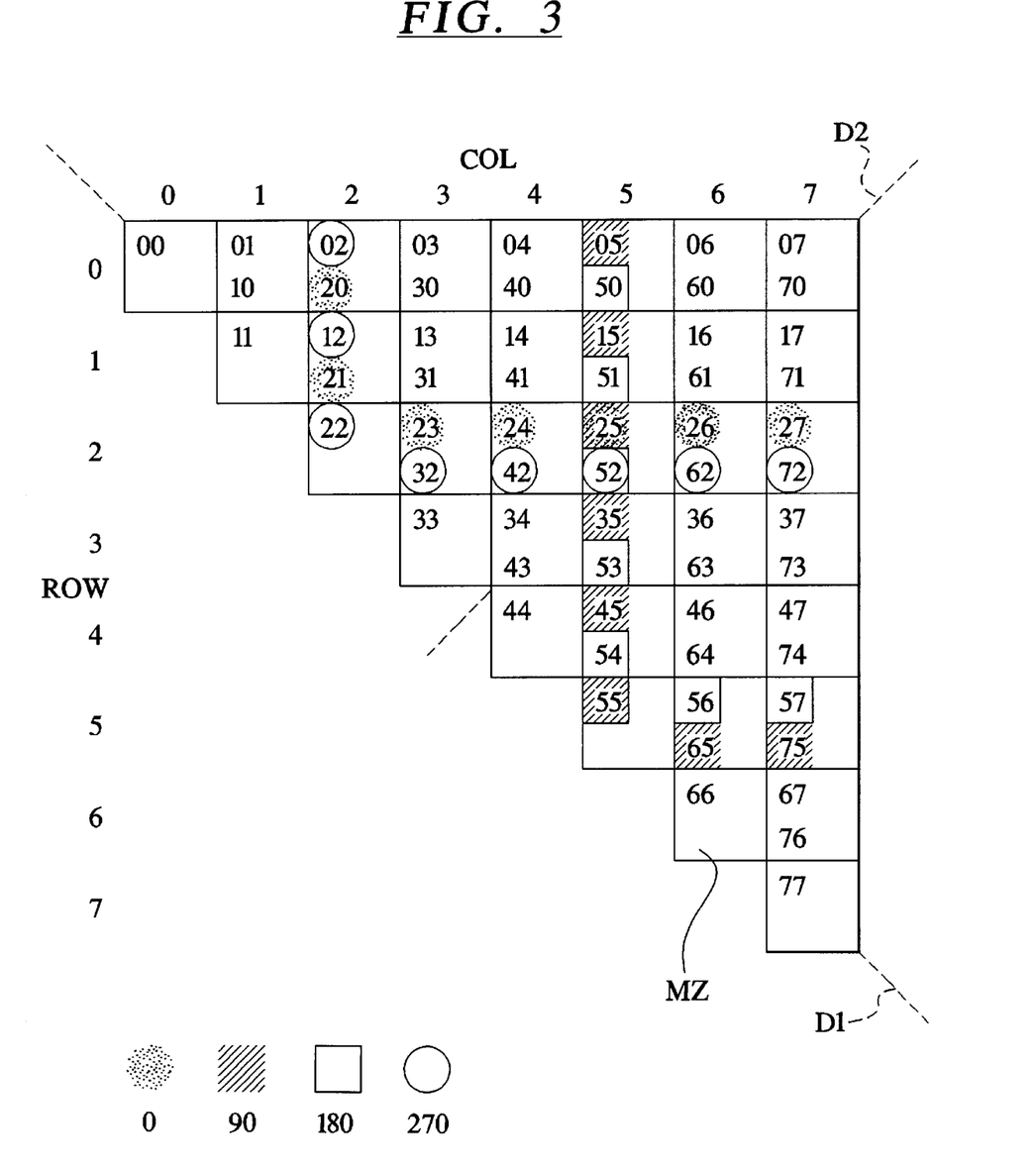
FIG. 3 is a schematic illustration of a memory matrix already folded once, with a further diagonal.

The cell indices of the original matrix are entered in the matrix cells MZ of the memory matrix of FIG. 3. The markings of the row 2 ROW (2) according to FIG. 2 were retained, including its rotated positions. The matrix cells MZ along the diagonal D1 are unchanged. However, respectively two cell indices are entered in the other matrix cells MZ. On the basis of the various rotational senses of the row 2 ROW (2), one can see that the cell indices of a column COL or of a row ROW are respectively located in different matrix cells MZ. Each column COL or row ROW can thus be read out in parallel. The memory matrix can now be folded a second time along a second diagonal D2 that proceeds from the matrix cell MZ with the cell indices 34, 43 to the matrix cell MZ with the cell indices 07, 70. The result of this folding is shown in FIG. 4.

One can see that respectively two cell indices are entered into the edge cells that are arranged along the two diagonals D1, D2. The other matrix cells MZ respectively contain four indices. The markings of the various rotational senses of the row 2 ROW (2) of FIG. 2 were retained. It is also assured here that the cell indices of a row ROW or column COL are located in different matrix cells MZ. Columns COL or rows ROW can thus be read out in parallel. Given a corresponding size, the matrix of FIG. 4 can be folded again along a third diagonal D3, D3'. The third diagonal D3 proceeds from the matrix cell MZ with the indices 12,21,56,65 to the matrix cell MZ with the cell indices 03,30,47,74, and the diagonal D3' proceeds from the matrix cell MZ with the cell indices 04,40,37,73 to the matrix cell MZ with the cell indices 15,51,26,62.

Figure 4:
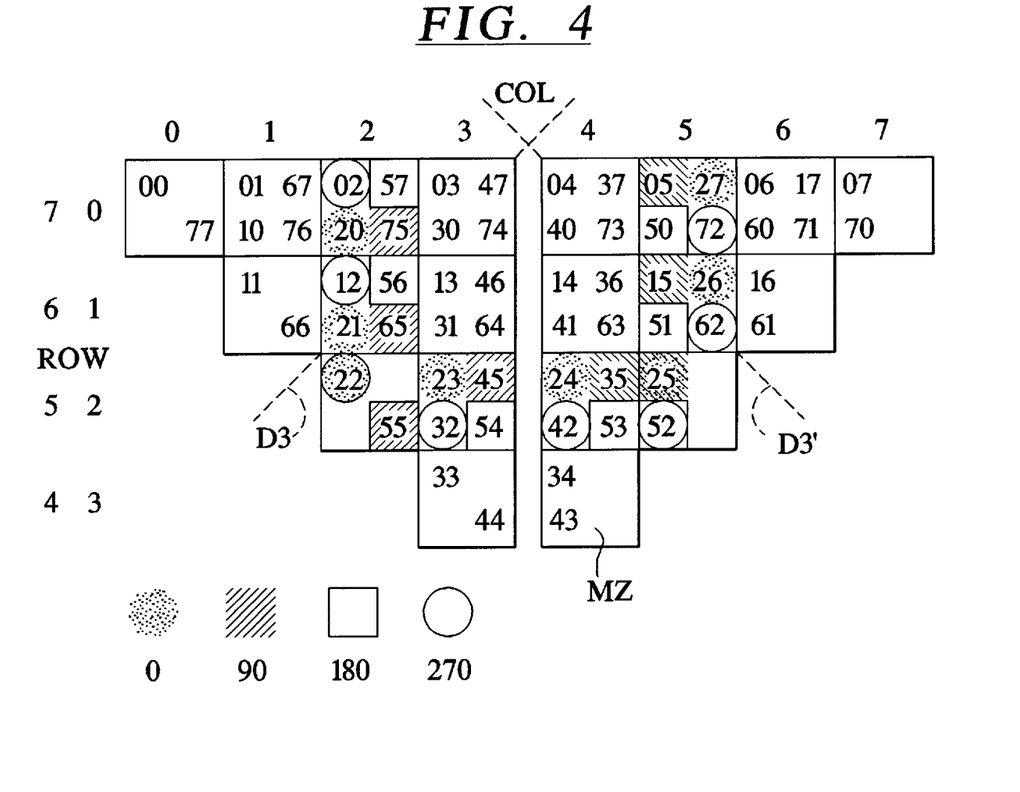
FIG. 4 is a schematic illustration of a memory matrix already folded twice, with a further diagonal
Figure 5:
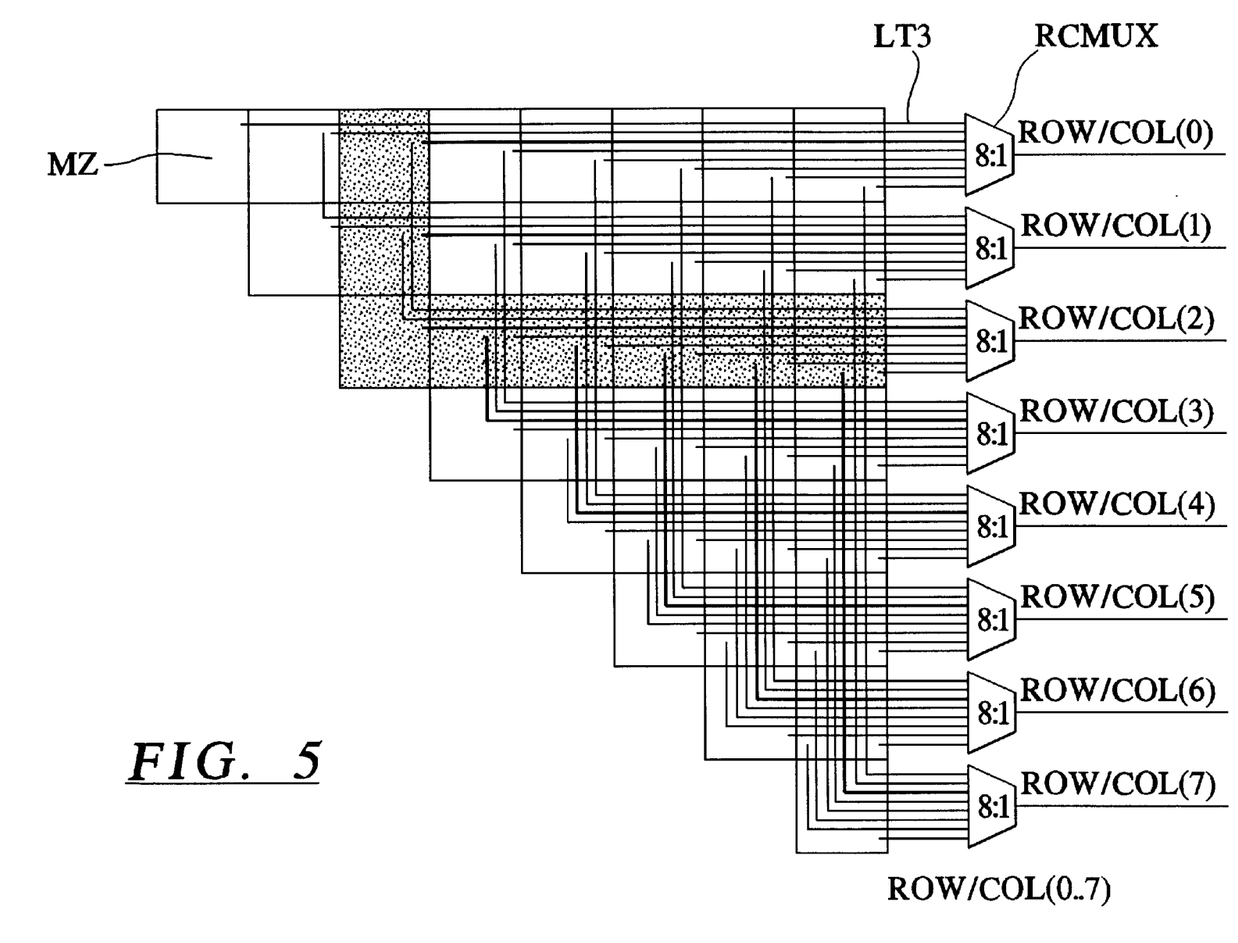
FIG. 5 is a schematic diagram of a memory matrix folded once, with line connections from the matrix cells to the peripheral selection elements.
Figure 6:
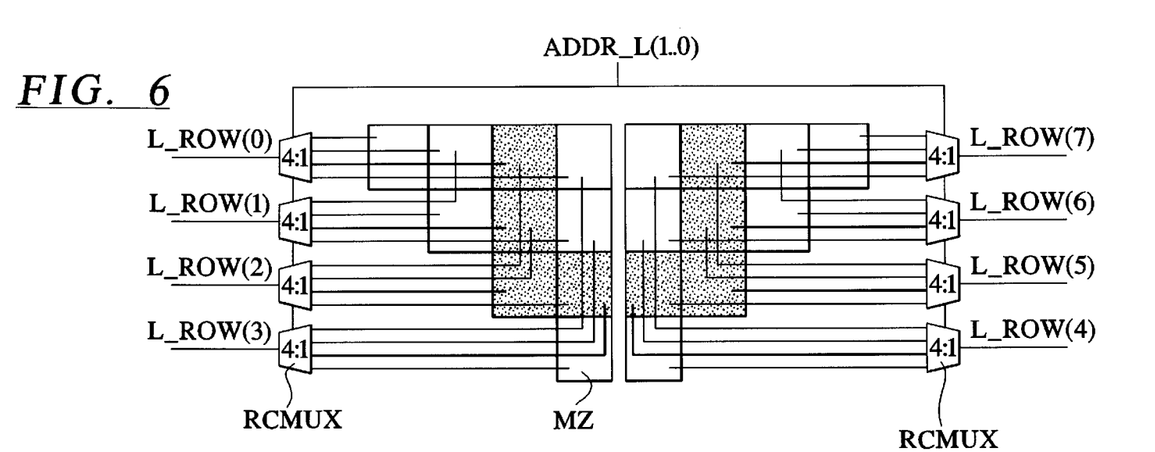
FIG. 6 is a schematic diagram of a matrix folded twice, with connecting lines from the matrix cells to the matrix periphery.

The wiring of the folded memory matrices of FIGS. 3 and 4 for connecting the data outputs DOUT of matrix cells MZ to the reproduction means WG is shown in FIGS. 5 and 6. The cell indices of the column 2 COL (2) and the row 2 ROW (2) of the original matrix are respectively located in common in a matrix cell MZ. The corresponding matrix cells MZ are shown shaded in FIGS. 5 and 6.

In the embodiment of FIG. 5, the matrix cells MZ are connected via third lines LT3 to column/row multiplexers RCMUX. The plurality of periphery multiplexers RCMUX is cut in half to eight due to the one-time folding of the memory matrix because a distinction no longer need be made between columns COL and rows ROW from outside the memory matrix. This distinction ensues in the matrix cells MZ, as explained in greater detail below.

Eight column/row multiplexers RCMUX are likewise required given the twice-folded matrix of FIG. 6. These column/row multiplexers RCMUX, however, comprise only half the inputs of the column/row multiplexers RCMUX given the once-folded matrix of FIG. 5. The number of matrix cells MZ of the memory matrix is reduced such by the second folding that a distinction between only four rows ROW or, respectively, columns COL now need be made from the outside. The cell indices of up to four matrix cells MZ of the original matrix are available in a matrix cell MZ. For example, the cell indices of the row 2 (ROW (2) for all rotational senses of this row ROW (2) thus reside in the matrix cells MZ shown shaded (FIG. 4).

Figure 8:
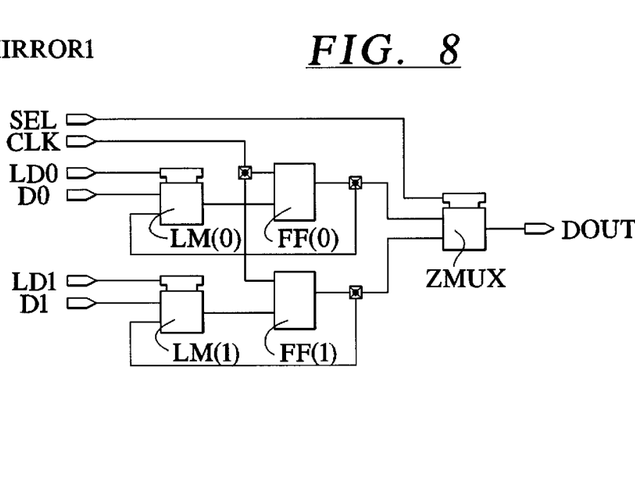
FIG. 8 is a diagram of an exemplary circuit of a matrix cell with two memory cells.

The structure of a matrix cell MZ with two memory cells SZ (two indices) is shown in FIG. 8. A memory cell SZ is composed of a flipflop FF(0 . . . 1) and of a loading multiplexer LM(0 . . . 1). A clock CLK is supplied to the flipflops FF(0 . . . 1). The output of each flipflop FF(0 . . . 1 ) is returned to an input of the loading multiplexer LM(0 . . . 1). The other input of the loading multiplexer LM(0 . . . 1) is connected to the periphery via a data line D(0 . . . 1). The loading multiplexer LM(0 . . . 1) is switched between a loading function and a holding function from the outside with a loading line LD(0 . . . 1). When pixels are thus to be written into a memory cell SZ, then a corresponding information is to be applied to the loading line LD(0 . . . 1), as a result whereof the image information pending at the data line D(0 . . . 1) is written into the memory cell SZ. To that end, the loading lines LD(0 . . . 1) are coupled with a loading control (not shown). The outputs of the flipflops FF(0 . . . 1) are respectively connected to an input of a cell multiplexer ZMUX serving an internal selection element. One of the outputs of the flipflops FF(0 . . . 1) is connected through to the data output DOUT of the matrix cell MZ with the assistance of this cell multiplexer ZMUX. The selection ensues with the assistance of a selection line SEL.

Figure 9:
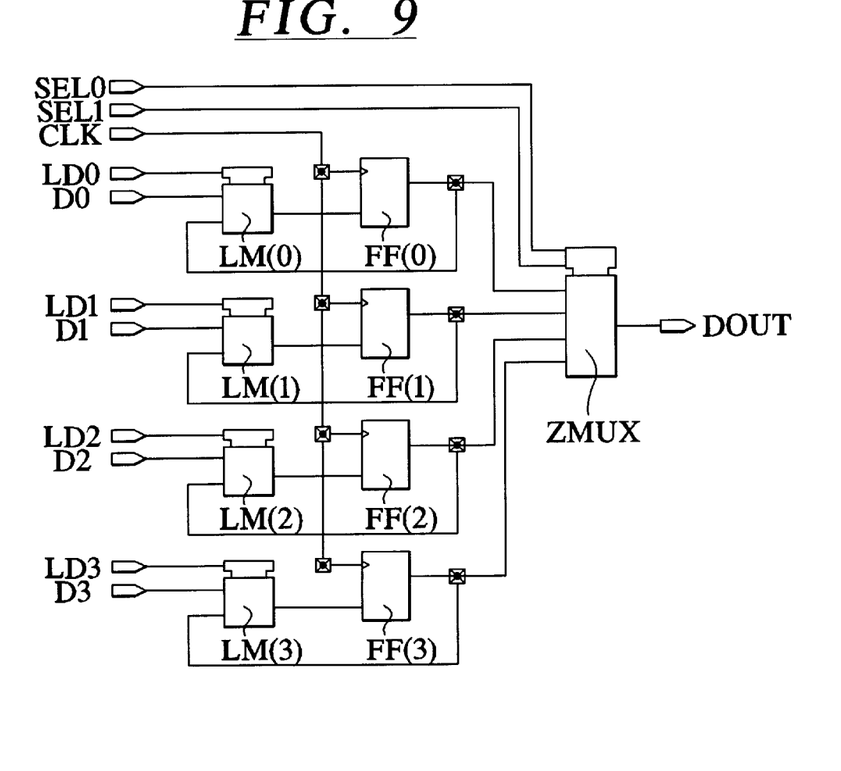
FIG. 9 is a diagram of an exemplary circuit of a matrix cell with four memory cells.

A matrix cell MZ that contains four memory cells SZ is constructed as shown in FIG. 9. The structure of the individual memory cells SZ of this matrix cell MZ corresponds to that described above according to FIG. 8. Corresponding to the plurality of memory cells SZ, the cell multiplexer ZMUX merely comprises four inputs that are selectively connectible to the data output DOUT. Two selection lines SEL(1 . . . 0) are required for the selection of a memory cell SZ. These selection lines SEL(1 . . . 0) are coupled to a readout control means according to FIG. 10.

Figure 7:
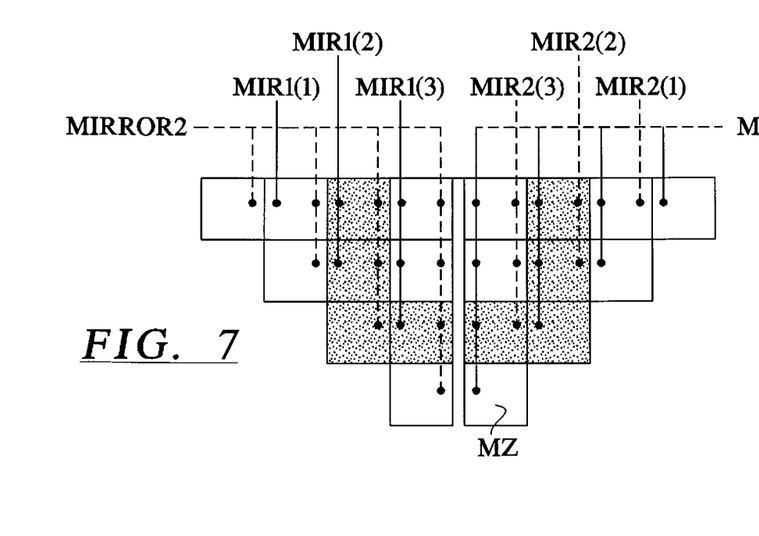
FIG. 7 is a schematic diagram of a matrix folded twice, with control lines to the selection elements of the matrix cells.
Figure 10:
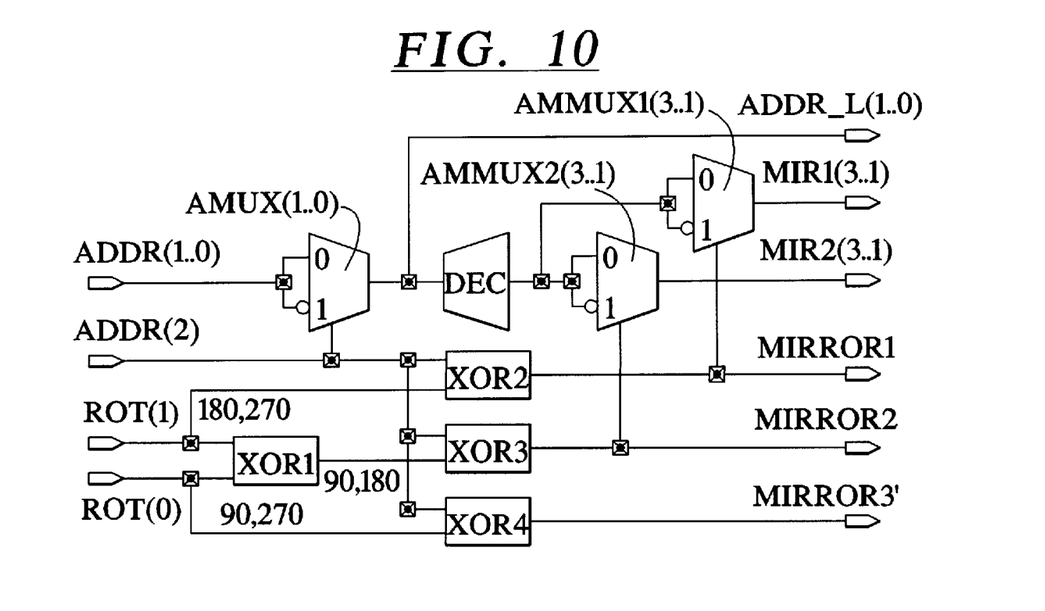
FIG. 10 is a circuit diagram of a readout control means for a memory matrix according to FIGS. 6 and 7.

FIG. 10 shows a readout control means for readout of a twice-folded matrix according to FIGS. 4, 6 and 7. The readout control means is supplied with a binarily coded address ADDR(2 . . . 0) that indicates a logical row ROW to be read out. The two low-order address bits ADDR(1 . . . 0) are supplied to a negating and to a non-negating input of an address multiplexer AMUX. Which of the inputs is connected through to the output of the address multiplexer is determined by the most significant address bit ADDR(2). The output of the address multiplexer AMUX is connected to the control lines ADDR_L(1 . . . 0) of the row/column multiplexer RCMUX and to the input of a decoder DEC. Dependent on the address ADDR(2 . . . 0), a logical row L_ROW(0 . . . 7) of the memory matrix is thus selected.

The inputs of two further address multiplexers AMMUX1, AMMUX2 are coupled to the output of the decoder DEC. The lowest-order address bits of the decoder DEC is not employed. Each of these further address multiplexers AMMUX comprises a non-inverting and an inverting input that can be selectively through-connected to the output. The output of the one address multiplexer AMMUX1 is coupled to a first control line bundle MIR1 (3 . . . 1). The output of the second address multiplexer AMMUX2 is coupled to a second control line bundle MIR2(3 . . . 1). The two address multiplexers AMMUX1, AMMUX2 are switched dependent on the most significant address bit ADDR(2) and on a rotation information adjacent at rotation lines ROT(1 . . . 0). The most significant address bit ADDR(2) and the rotation information are operated with one another by four exclusive-OR gates XOR1, XOR2, XOR3, XOR4. The rotation lines ROT(1 . . . 0) are coupled to the two inputs of the first exclusive-OR gate XOR1 and to a respective input of the second exclusive-OR gate XOR2 and of the fourth exclusive-OR gate XOR4. The output of the first exclusive-OR gate XOR1 is coupled to an input of the third exclusive-OR gate XOR3. The most significant address bit ADDR(2) is coupled to a respective input of the second, third and fourth exclusive-OR gate XOR2, XOR3, XOR4. The output of the second exclusive-OR gate XOR2 switches the address multiplexer AMMUX1 over and is coupled to the line MIRROR1. The output of the third exclusive-OR gate XOR3 switches the address multiplexer AMMUX2 over and is coupled to the line MIRROR2. The output of the fourth exclusive-OR gate XOR4 is coupled to the line MIRROR3'.

As FIG. 7 shows, the control lines MIR1, MIR2, MIRROR1, MIRROR2 are coupled to the selection lines SEL(1 . . . 0) of the cell multiplexers ZMUX. The memory matrix is divided into two symmetrically constructed parts. The columns COL(0 . . . 3) thereby form the left half and the columns COL(4 . . . 7) form the right half. Each of the matrix cells of the left half of the memory matrix is coupled to the fourth control line MIRROR2. To that end, the fourth control line MIRROR2 is connected to the selection line SEL in the edge cells (two memory cells) and to the selection line SELL of the cell multiplexer ZMUX in the core cells (four memory cells). The selection lines SEL0 of the core cells of the left half of the memory matrix are respectively connected by columns to one of the first control lines MIR1(3 . . . 1).

The selection lines SEL of the edge cells and the selection lines SEL0 of the core cells of the right half of the memory matrix are connected to the third control line MIRROR1.

The selection lines SEL1 of the core cells of the right half of the memory matrix are respectively connected by columns to one of the second control lines MIR2(3 . . . 1).

The fifth control line MIRROR3' controls a multiplexer arrangement (not shown) constructed in row width. The outputs of the row/column multiplexers RCMUX are connected such to the inputs of the 2:1 multiplexer arrangement that the first inputs of the multiplexer arrangement are coupled to the logical row L_ROW(0 . . . 7) in ascending sequence and the logical row L_ROW(7 . . . 0) are coupled to the second inputs of the multiplexer arrangement in reverse sequence. The bit sequence of a readout logical row L_ROW(0 . . . 7) or, respectively, L_ROW(7 . . . 0) can thus be reversed by signal inversion at the fifth control line MIRROR3'.

Figure 11:
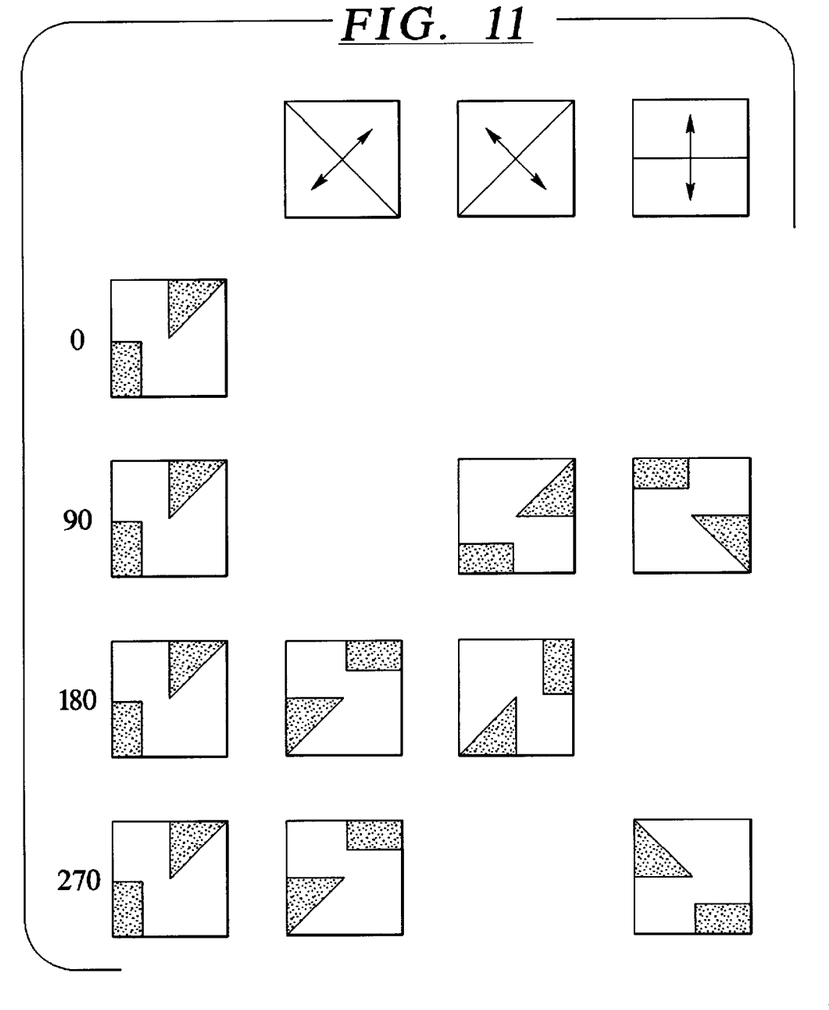
FIG. 11 is a schematic illustration of the individual operations given readout of the memory matrix for various rotational senses.

FIG. 11 shows a schematic illustration of the rotation of a bit pattern. Four different rotated positions, namely a rotation by 0°, a rotation by 90°, a rotation by 180°, and a rotation by 270°, are shown above one another in vertical direction. The appertaining operations that are required proceeding from a rotation of 0° in order to arrive at the desired rotated position are shown in horizontal direction. Accordingly, no operations are required for a rotation by 0°. A mirroring at the second diagonal D2 (MIRROR2) and subsequent mirroring of the row bisector (proceeds between row3 and row4) of the memory matrix (MIRROR3) is required for a rotation by 90°. A mirroring at the first and at the second diagonal (MIRROR1, MIRROR2) are required given a rotation by 180°. A mirroring at the first diagonal D1 (MIRROR1) with subsequent mirroring of the rows at the row bisector of the memory matrix (MIRROR3') is required for a rotation by 270°. The mirroring at the row bisector (MIRROR3') corresponds to a mirroring at the column bisector in the original matrix because this mirroring is preceded by a mirroring at the first or at the second diagonal D1, D2.

The respective operations can be implemented with the assistance of the inventive memory matrix and the readout control means thereof. This readout operation is explained below with reference to FIGS. 4, 4a, 6, 7 and 10. The address ADDR(2 . . . 0) for the selected row 2 ROW(2) is 010. A rotation by 180° ensues. A logical 1 is present at the rotation line ROT(1) and a logical zero is present at the rotation line ROT(0). Correspondingly, a logical 1 is present at the output of the first exclusive-OR gate XOR1. Consequently, a logical 1 is present at the third control line MIRROR1, a logical 1 is present at the fourth control line MIRROR2, and a logical 0 is present at the fifth control line MIRROR3'. The address multiplexer AMUX outputs the two low order address bits ADDR(1 . . . 0) unmodified to the control line ADDR_L(1 . . . 0). The matrix cells MZ shaded in FIGS. 4, 6 and 7 are thereby selected. The decoder DEC works according to the following truth table:

| ADDR(1) | ADDR(0) | MSB | | | LSB |
|---|---|---|---|---|---|
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

The least significant bit LSB of this truth table is not needed. The other three bits are negated by the address multiplexers AMMUX1, AMMUX2. Correspondingly, the following allocation applies for the logical statusses that are present at the first and second control lines:

| MIR1(3) | 1 | MIR2(3) | 1 |
|---|---|---|---|
| MIR1(2) | 0 | MIR2(2) | 0 |
| MIR1(1) | 1 | MIR2(1) | 1 |

Figure 4A:
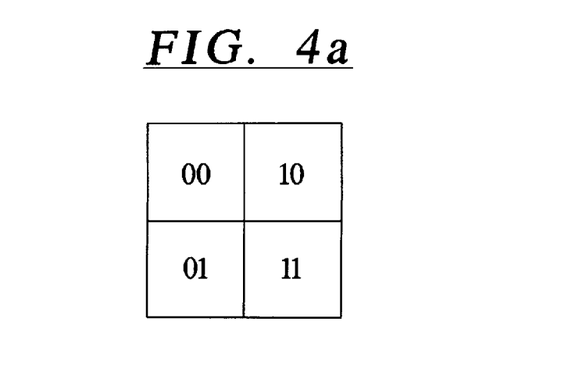
FIG. 4a is a truth table of possible values.

For easier understanding, let the individual memory cells SZ of the core cells according to FIG. 4 be arranged according to the illustration in FIG. 4a. The higher order bit indicates the logical status present at the second selection line SEL(1) and the low order bit indicates the logical status at the first selection line SEL(0). According to the above-described connections between the selection lines SEL(1 . . . 0) and the control lines MIR1(3 . . . 1), MIRROR2 in the left half of the memory matrix, the following control signal is present in the matrix cell MZ of the column 2 COL(2) and the row 7 or, respectively, 0 ROW(7 0):

SEL0=0 MIR1(2) and SEL1=1=MIRROR2.

Accordingly, the memory cell SZ with the index 57 is selected. The corresponding case applies to the other cells of the left half of the memory matrix.

The above-described connections between the control lines MIRROR1, MIR2(3 . . . 1) and the selection lines SEL(0), SEL(1) are realized in the right half of the memory matrix. Correspondingly, the following control signal is present, for example, in the matrix cell of the column 5 COL(5) and the row 6 or, respectively, 1 ROW(6 1):

SEL0=1 MIRROR1 and SEL1=0=MIR2(2).

Accordingly, the memory cell SZ with the index 51 is selected. The corresponding case applies to the other cells of the right half of the memory matrix.

The content of the row 5 ROW(5) rotated by 180° is thus available in parallel at the output of the row/column multiplexer RCMUX. All rows 0 or, respectively, 7 ROW(0 . . . 7) are successively read out rotated by 180° in this way. Given a rotation by 90 or 270°, correspondingly other logical statusses must be set at the rotation lines ROT(1 . . . 0) according to the following table:

| Rotation | ROT(1) | ROT(0) |
|---|---|---|
| 0° | 0 | 0 |
| 90° | 0 | 1 |
| 180° | 1 | 0 |
| 270° | 1 | 1 |

These logical statusses of the rotation lines ROT(1 . . . 0) are converted such with the readout control means that a mirroring is implemented at the second diagonal D2 given a rotation by 90° and a mirroring is implemented at the first diagonal D1 given a rotation by 270°. In both instances, a transposition of the sequence of the bit information read out is implemented by the multiplexer arrangement at which a logical one pends with the fifth control line MIRROR3'.

Memory matrices of different sizes can be constructed in this way while eliminating a great number of lines. The following table indicates the potential elimination of lines dependent on the matrix size and the number of foldings.

| Matrix size | n | 8 | 16 | 32 | 64 |
|---|---|---|---|---|---|
| Memory cells (SZ) | n^2 | 64 | 256 | 1024 | 4096 |
| Output lines (LT) | 2*n^2 | 128 | 512 | 2048 | 8192 |
| Matrix cells (MZ) 1) | (n^2/2) + (n/2) | 36 | 136 | 528 | 2080 |
| Output lines (LT) 1) | n^2 | 64 | 256 | 1024 | 4096 |
| Control lines (MIR) 1) | n | 8 | 16 | 32 | 64 |
| Matrix cells (MZ) 2) | (n^2/4) + (n/2) | 20 | 72 | 272 | 1056 |
| Output lines (LT) 2) | n^2/2 | 32 | 128 | 512 | 2048 |
| Control lines (MIR) 2) | n + 1 | 9 | 17 | 33 | 65 |
| Output lines (LT) x) | n^2/2^x | | | | |
| Matrix cells x) | (n^2/2^x) + (n/2) | | | | |
| Eliminated lines 1) | (LT) − (LT)1) − (MIR)1) | 56 | 240 | 992 | 4032 |
| Eliminated lines 2) | (LT) − (LT)2) − (MIR)2) | 87 | 367 | 1503 | 6079 |

1) Matrix folded once
2) Matrix folded twice
x) Matrix folded x times

For example, given an original matrix having the size n=8 that was folded twice, 87 output lines are thus eliminated taking the additionally required control lines MIR into consideration.

Although other modifications and changes may be suggested by those skilled in the art, it is the intention of the inventors to embody within the patent warranted hereon all changes and modifications as reasonably and properly come within the scope of their contribution to the art.

I claim:

1. A method for storing and rotating bit patterns in a raster module that includes a memory matrix that contains a plurality of matrix cells and can be coupled to a reproduction means via peripheral selection elements, comprising the following method steps:

storing a bit pattern present in the form of pixels of an original matrix such that at least one pixel of the original matrix is stored in each matrix cell of the memory matrix; and reading the bit pattern out from the memory matrix, whereby specific matrix cells are selected dependent on a rotation information and respectively one pixel within these matrix cells is selected with an internal selection element and read out to the reproduction means.

2. A method for storing and rotating bit patterns according to claim 1, wherein said step of storing provides that the pixels of the original matrix are stored such in the matrix cells of the memory matrix that each matrix cell contains the pixels that are congruent with one another after folding the original matrix over at least one of its diagonals.

3. A method for storing and rotating bit patterns according to claim 1, further comprising the step of:

providing a raster module that is allocated to an electrographic printer and in whose memory matrix the bit pattern is stored row-by-row or column-by-column and is read out row-by-row or column-by-column.

4. A raster module for storing and rotating bit patterns, comprising:

a memory matrix that contains a plurality of matrix cells and that can be coupled to a reproduction means via peripheral selection elements;

at least one memory cell per matrix cell for storing a bit pattern present in the form of pixels of an original matrix such that at least one pixel of the original matrix is storable in each matrix cell of the memory matrix;

internal selection elements in the matrix cells for selection of specific memory cells within the matrix cells and for coupling outputs of these memory cells to the reproduction means; and a readout control means that drives the selection elements dependent on a rotation information of the bit pattern.

5. A raster module for storing and rotating bit patterns according to claim 4, further comprising:

means for reading out bit patterns row-by-row or column-by-column to the reproduction means, including matrix cells that respectively comprise a data output, respectively contain memory cells for the acceptance of the pixels of an original quadratic matrix that lie on top of one another given folding of said original matrix at at least one of its diagonals, respectively contain an internal selection element for coupling their data output to respectively one of the memory cells contained in them; and peripheral selection elements for the selective coupling of the data outputs of matrix cells to the reproduction means.

6. A raster module for storing and rotating bit patterns according to claim 4, further comprising:

a transposition means arranged preceding the reproduction means that selectively reverses the sequence of the pixels of a read out column or row dependent on its drive by the readout control means.

7. A raster module for storing and rotating bit patterns according to claim 4, further comprising:

a memory matrix for storing an original matrix with n columns and n rows folded x-times at its diagonals, whereby said memory matrix comprises $$\frac{n^2}{2^x} + \frac{n}{2}$$

matrix cells.

8. An electrographic printer with a raster module for storing and rotating bit patterns, comprising:

a memory matrix that contains a plurality of matrix cells and that can be coupled to a reproduction means via peripheral selection elements;

at least one memory cell per matrix cell for storing a bit pattern present in the form of pixels of an original matrix such that at least one pixel of the original matrix is storable in each matrix cell of the memory matrix;

internal selection elements in the matrix cells for the selection of specific memory cells within the matrix cells and for coupling the outputs of these memory cells to the reproduction means; and a readout control means that drives the selection elements dependent on a rotation information of the bit pattern.

* * * * *